United States Patent [19]
Quigley et al.

[11] Patent Number: 5,371,424
[45] Date of Patent: Dec. 6, 1994

[54] TRANSMITTER/RECEIVER CIRCUIT AND METHOD THEREFOR

[75] Inventors: John H. Quigley; James S. Caravella, both of Phoenix, Ariz.

[73] Assignee: Motorola, Inc., Schaumburg, Ill.

[21] Appl. No.: 981,451

[22] Filed: Nov. 25, 1992

[51] Int. Cl.$^5$ ............... H03K 19/0175; H03K 19/094
[52] U.S. Cl. ...................................... 326/63; 326/121; 327/333
[58] Field of Search ............... 307/475, 473, 446, 455, 307/451

[56] References Cited

U.S. PATENT DOCUMENTS

| | | | |
|---|---|---|---|
| 4,656,375 | 4/1987 | Lauffer et al. | 307/475 |
| 4,797,583 | 1/1989 | Ueno et al. | 307/446 |
| 4,864,159 | 9/1989 | Cornelissen | 307/475 |
| 4,888,501 | 12/1989 | Sanwo et al. | 307/475 |
| 4,972,517 | 11/1990 | Kondou et al. | 307/475 |
| 5,023,488 | 6/1991 | Gunning | 307/475 |
| 5,045,730 | 9/1991 | Cooperman et al. | 307/475 |
| 5,136,189 | 8/1992 | Demaris | 307/475 |
| 5,206,544 | 4/1993 | Chen et al. | 307/443 |
| 5,225,717 | 7/1993 | Shiomi et al. | 307/446 |

OTHER PUBLICATIONS

Mark Pederson et al., "High-Speed Digital Circuits", 1989 IEEE International Solid State Circuits Conference, Digest of Technical Papers, Feb. 1989.
Kevin Lam et al. "Simultaneous Bidirectional Signaling for IC Systems", 1900 IEEE International Conference on Computer Design, Sep. 1990.

*Primary Examiner*—Edward P. Westin
*Assistant Examiner*—Richard Roseen
*Attorney, Agent, or Firm*—Gary W. Hoshizaki

[57] ABSTRACT

A transmitter/receiver circuit (19) for interfacing digital signals having logic levels of different voltage ranges. The transmitter/receiver circuit comprises a transmitter circuit (21), a resistive load (23), and a receiver circuit (22). The transmitter circuit (21) having a first input (24) which receives a digital signal of a first voltage range, a second input (26) which receives a control signal, a first terminal (27) and a second terminal (28). The resistive load (23) couples the first (27) and second (28) outputs together. The transmitter circuit (21) generates complementary digital signals at the first terminal (27) and the second terminal (28) having logic levels of a second voltage range. The transmitter circuit (21) can be disabled by the control signal. The receiver circuit (22) has a first and a second input coupled to the first (27) and second (28) terminals respectively and has an output (29). The receiver circuit (22) senses a voltage difference between the first (27) and second (28) terminals and generates a digital signal of the first voltage range at the output (29).

16 Claims, 2 Drawing Sheets

TRANSMITTER/RECEIVER CIRCUIT AND METHOD THEREFOR

BACKGROUND OF THE INVENTION

This invention relates, in general, to transmitter/receiver circuits, and more particularly to transmitter/receiver circuits for interfacing digital circuits having logic levels of two different voltage ranges.

System designs based on multiple interconnected integrated circuits are achieving extremely high system speeds. Higher transistor densities, increased functionality on a chip, increased levels of interconnect, and packaging advances are but a few of the areas where significant gains have been made to enhance system performance. Integrated circuit system speeds are often limited by a particular class of circuits or an individual circuit which must drive a highly capacitive or inductive load. The circuit or circuits limiting system speed can be anywhere on the integrated circuit. One class of circuits which are notorious for limiting system speed are input/output circuits or I/O circuits. Input/output circuits are the external interface of the integrated circuit and often must drive highly inductive or capacitive loads. Transmission line effects can also affect signal quality if the I/O circuits transfer data at high speeds. For example, a digital system comprising multiple CMOS integrated circuits can be limited in system speed by the ability of each integrated circuit to transfer information between each other. CMOS integrated circuits commonly operate at 5 volts. A one logic level is approximately 5 volts and a zero logic level is approximately zero volts in a five volt system. A CMOS interface circuit is limited in drive strength due to the performance characteristics of a CMOS device and size limitations of an input/output site (where the interface circuitry is placed). Large capacitive and inductive loading on the interface circuit and "rail to rail" (zero to five volt) signal swings limit the speed in which information can be transferred.

A universal approach used throughout the industry to achieve higher transfer speeds is to reduce signal swing levels. The concept is extremely simple, it takes less time to generate a small voltage change than it does to generate a large voltage change for a given loading. For bipolar circuits, Emitter Coupled Logic (ECL) is a common approach, for CMOS circuits, Gunning Transceiver Logic (GTL) is extensively used. Although speed is gained by using small signal levels there are disadvantages. A few of the disadvantages are reduced noise margins, increased circuit complexity, and increased D.C. power dissipation. Also, circuitry internal to the integrated circuit, is typically responsive to digital signals having logic levels of a larger voltage range, thus the small signal levels at the interface must be translated to the internal logic levels.

Of particular interest is Gunning Tranceiver Logic (GTL), this is made more so by the increased demand and usage of CMOS circuitry for high performance integrated circuit systems. GTL is an interface approach well known by those skilled in the art. Two distinct circuits are used in GTL, they are a transmitting circuit and a receiving circuit. An input/output cell of an integrated circuit must have both types of circuits if it is to receive and transmit data. Signal levels used in GTL are Voh~1.2 volts (one logic state) and Vol~0.4 volts (zero logic state). A load resistor or pull up resistor is coupled to a 1.2 volt voltage reference and a signal line. A single resistor or multiple load resistors are used depending on the configuration, the load resistor also acts as a termination to reduce reflections. A GTL transmitter circuit is an open drain n-channel CMOS transistor coupled to the signal line for generating a zero logic state on the signal line. The load resistor generates a one logic state on the signal line when all transmitter circuits are disabled. A GTL receiver circuit is a comparator with an input coupled to a 0.8 volt voltage reference and a second input coupled to the signal line. The receiver circuit receives a one or zero logic state from the signal line and outputs a corresponding one or zero logic state at the internal integrated circuit logic levels.

Reducing signal swings to 800 millivolts not only increases speeds at which data can be transferred within a system but reduces crosstalk between signal lines and reduces power dissipation. GTL circuitry can be fabricated using devices standard to a CMOS process flow. The load resistor or pull-up resistor which also acts as a termination resistor can be fabricated on chip or added on as an external component. Although GTL solves many of the problems for increasing system performance it also has some negative features. First, GTL is not directly compatible with ECL interface logic, thus it does not lend itself to mixed use (ECL and GTL circuits in the same system). Second, GTL requires a stable 0.8 voltage reference which adds circuitry (and complexity) to the interface logic. Third, a stable 1.2 volt power supply must be added which can handle large transient currents. Fourth, GTL is difficult to design for differential coupling which is essential to decrease noise through common mode rejection. Fifth, the speed at which a one logic level is generated is limited by the value of the termination resistor. Sixth, power dissipation can be a problem when hundreds of transmitter/receiver circuits are used on a integrated circuit. The current to generate a zero logic level is not insignificant. Finally, the industry is moving to lower power supply voltages for CMOS circuitry from 5 volts to 3 volts, the open drain n-channel devices used in GTL to generate a zero logic level will have to drastically increase in size to maintain speeds at the lower voltages.

It would be of great benefit if a digital logic transmitter/receiver circuitry could be developed which is compatible with ECL logic levels, eliminate the need for secondary power supply voltage levels or reference voltages, reduce the need for termination resistors, have both single ended and differential drive, is functional at 5 volts or 3 volts, and is compatible with multiple technologies (CMOS, Bipolar, etc.).

SUMMARY OF THE INVENTION

Briefly stated, there is provided a circuit and method for sending and receiving a digital signal. The circuit comprises a first transistor and a second transistor. The first transistor is of a first conductivity type and is in a voltage follower configuration. The first transistor has a control input responsive to a digital signal of a first voltage range, a first conductive terminal coupled to a terminal of a first power supply, and a second conductive terminal coupled to an output. The second transistor is of a second conductivity type and is in a voltage follower configuration. The second transistor has a control input responsive to a digital signal of the first voltage range, a first conductive terminal coupled to a terminal of a second power supply, and a second conductive terminal coupled to the output. The first and second transistors generate a digital signal of a second voltage range in response to the digital signals of the first voltage range coupled to the control inputs.

DETAILED DESCRIPTION OF THE DRAWINGS

Figure 1:
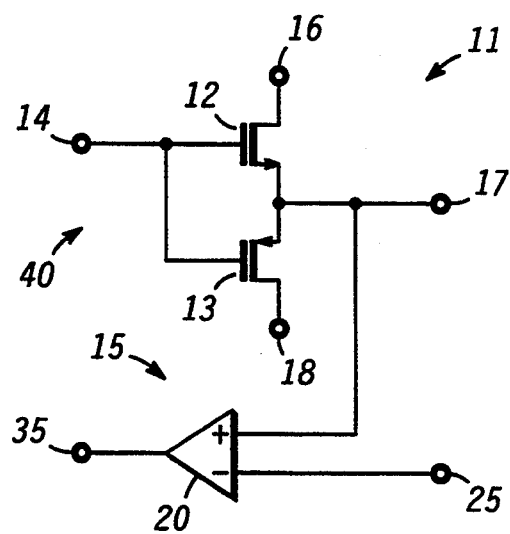
FIG. 1 is a schematic of a simplified circuit responsive to a digital signal of a first voltage range which generates a digital signal of a second voltage range in accordance with the present invention.

FIG. 1 is a schematic of a circuit responsive to a digital signal having logic levels of a first voltage range which generates a digital signal having logic levels of a second voltage range in accordance with the present invention.

It is well known by those skilled in the art that a circuit will produce a small voltage change in less time than it takes to produce a large voltage change. This premise has been used extensively for circuit families such as the bipolar based Emitter Coupled Logic (ECL) and the CMOS based Gunning Transceiver Logic (GTL). For example, a standard 5.0 volt complementary MOSFET (CMOS) process flow with 1.0 micron gate lengths has a maximum system speed of 50 megahertz (MHZ) due to limitations of the input/output circuitry (I/O). The maximum speed at which an I/O circuit operates is influenced by such factors as device geometries, external loading (capacitive, resistive, and inductive), and the voltage change which must be produced. Device geometries are limited by the area allocated for the I/O site. External loading can vary drastically depending on the circuit application. The voltage difference between digital logic levels is dependent on the specific technology being used. Reducing the voltage difference or voltage range between logic levels can increase speeds greatly. Although faster, smaller signal levels result in lower noise immunity and sometimes higher circuit complexity and power dissipation. Secondary problems may include transmission line effects (overshoot, ringing, reflections etc.), latchup, added external components (termination resistors etc.), added reference voltages, and simultaneous switching noise. A problem in the near future will result when power supply voltages for CMOS integrated circuits migrate from 5.0 volts to 3.0 volts which may affect both functionality and performance of a small signal swing circuit.

This invention provides a transmitter/receiver circuit 11 for transmitting and receiving small voltage swing digital logic levels for high speed data transfer. Transmitter/receiver 11 circuit greatly reduces the problems listed above, yet is extremely simple, fast, and technology independent (compatible with bipolar, CMOS, gallium arsenide, etc.). The transmitter/receiver circuit is broken into two basic circuits, a transmitter circuit 40 and a receiver circuit 15. Transmitter circuit 40 is responsive to "standard" digital logic levels common to the process technology. For example, a five volt CMOS process has standard logic levels of approximately five volts (one logic level) and approximately zero volts (zero logic level). Transmitter circuit 40 translates a digital signal having the standard logic levels of a first voltage range and outputs a digital signal having reduced digital logic levels of a second voltage range. Conversely, receiver circuit 15 translates a digital signal of the second voltage range and outputs a digital signal of the first voltage range. Both circuits function independently from one another. It is obvious that a transmitter/receiver circuit may comprise only transmitter circuit 40 or receiver circuit 15 (as well as both) depending on the specific application.

Transmitter/receiver circuit 11 is an interface circuit which translates digital signals of two different voltage ranges for high speed data transfer. Transmitter circuit 40 comprises a transistor 12 and a transistor 13 both of which are in a voltage follower configuration. In the preferred embodiment, transistor 12 is a n-channel enhancement MOSFET corresponding to a first conductivity type and transistor 13 is a p-channel enhancement MOSFET corresponding to a second conductivity type. Transistors 12 and 13 have a control electrode, a first conductive electrode or terminal, and a second conductive electrode or terminal corresponding to a gate, a drain, and a source, respectively. Transistor 12 has a gate coupled to an input 14, a drain coupled to a terminal of a first power supply 16, and a source coupled to a terminal 17. Transistor 13 has a gate coupled to input 14, a drain coupled to a terminal of a second power supply 18, and a source coupled to terminal 17.

An explanation of the operation of transmitter circuit 40 is best illustrated by example. In this example, power supply 16 outputs three volts, power supply 18 outputs zero volts (or ground), and transistors 12 and 13 have threshold voltages of one volt. Where the threshold voltage is understood here to be the effective transistor turn on voltage at the operating bias point. Transmitter/receiver circuit 11 is responsive to an input digital signal coupled to input 14. An input digital signal has standard logic levels of approximately three volts for a one (or high) logic level and approximately ground for a zero (or low) logic level. The input digital signal is coupled to input 14.

Transistor 12 generates a one logic level at terminal 17 when input 14 transitions from a zero logic level to a one logic level. Transistor 12 "follows" the input digital signal voltage magnitude but outputs a voltage reduced by its gate to source voltage. Transistor 12 will output a maximum voltage at terminal 17 when the input digital signal is at three volts. Transistor 12 will turn off when the gate to source voltage is approximately the threshold voltage (one volt). Thus a one logic level at terminal 17 is approximately three volts (gate voltage) minus the threshold voltage (one volt) which is two volts.

Similarly, transistor 13 generates a zero logic level at terminal 17 when input 14 transitions from a one logic level to a zero logic level. Transistor 13 "follows" the input digital signal voltage magnitude but outputs a voltage increased by its gate to source voltage. Transistor 13 will output a minimum voltage at terminal 17 when the input digital signal is at zero volts. Transistor 13 will turn off when the gate to source voltage is approximately the threshold voltage (one volt). Thus a zero logic level at terminal 17 is approximately zero volts (gate voltage) plus the threshold voltage (one volt) which is one volt.

Note that non-inverting circuit 11 generates an output digital signal (at terminal 17) which swings between one volt and two volts. The output digital signal of reduced magnitude is produced using the natural features of transistors 12 and 13. No additional power supplies or reference voltages are needed to produce the output digital signal having logic levels of a second voltage range. The output digital signal is centered between the voltages output by power supply 16 and 18 which in this example is one and a half volts.

Transmitter circuit 40 can operate at extremely high speeds. In fact, operation of circuit 40 is subject to transmission line effects such as reflections and ringing when coupled to other circuits. The use of the voltage follower configuration for transistors 12 and 13 eliminates the need for termination resistors commonly used for small signal swing technologies such as Emitter Coupled Logic (ECL) or Gunning Transceiver Logic (GTL) for a point to point connection. The voltage follower configuration presents a low impedance at terminal 17 when either transistor 12 or 13 is enabled. This impedance increases as the signal level moves towards its final value. The effective impedance at the transmitting end will terminate or dampen a reflection which returns to terminal 17 thus reducing signal cancellation effects at the receiving end of the point to point connection.

Another factor which plays a dominant role in the speed of transmitter circuit 40 is that the voltage follower configuration is unity gain. Other transmitter configurations, such as in GTL, have a gain stage which is subject to "Miller" capacitance effects which can significantly affect performance. Transmitter circuit 40 operates by "following" the transition edge-speed of the input digital signal thereby producing a transition edge speed similar to the input signal. A secondary effect which modifies the one and zero logic levels of the second voltage range is back bias or bulk effect which changes transistor threshold voltage. This effect will be described in more detail in FIG. 2.

Receiver circuit 15 comprises a comparator 20. Receiver circuit 15 is responsive to a digital signal at terminal 17 having logic levels of the second voltage range and outputs a digital signal of the first voltage range. Comparator 20 has a first input (+) coupled to terminal 17, a second input (−) coupled to a voltage reference 25, and a output 35. The voltage reference voltage is chosen to be between the one logic level and zero logic level of the second voltage range which for the example above is one and a half volts. A one logic level (two volts) at terminal 17 creates a positive differential voltage of a half a volt across the comparator inputs which is amplified by comparator 20 to generate a one logic level at output 35 of approximately three volts. Similarly, a zero logic level (1 volt) at terminal 17 creates a negative differential voltage of a half a volt across the comparator inputs which is amplified by comparator 20 to generate a zero logic level at output 35 of approximately zero volts. Both the one and zero logic levels generated by the comparator are of the first voltage range.

Although in this example enhancement MOSFETs were used in transmitter circuit 40 it should be obvious to those skilled in the art that this configuration can be used for numerous other technologies such as bipolar or gallium arsenide.

Figure 2:
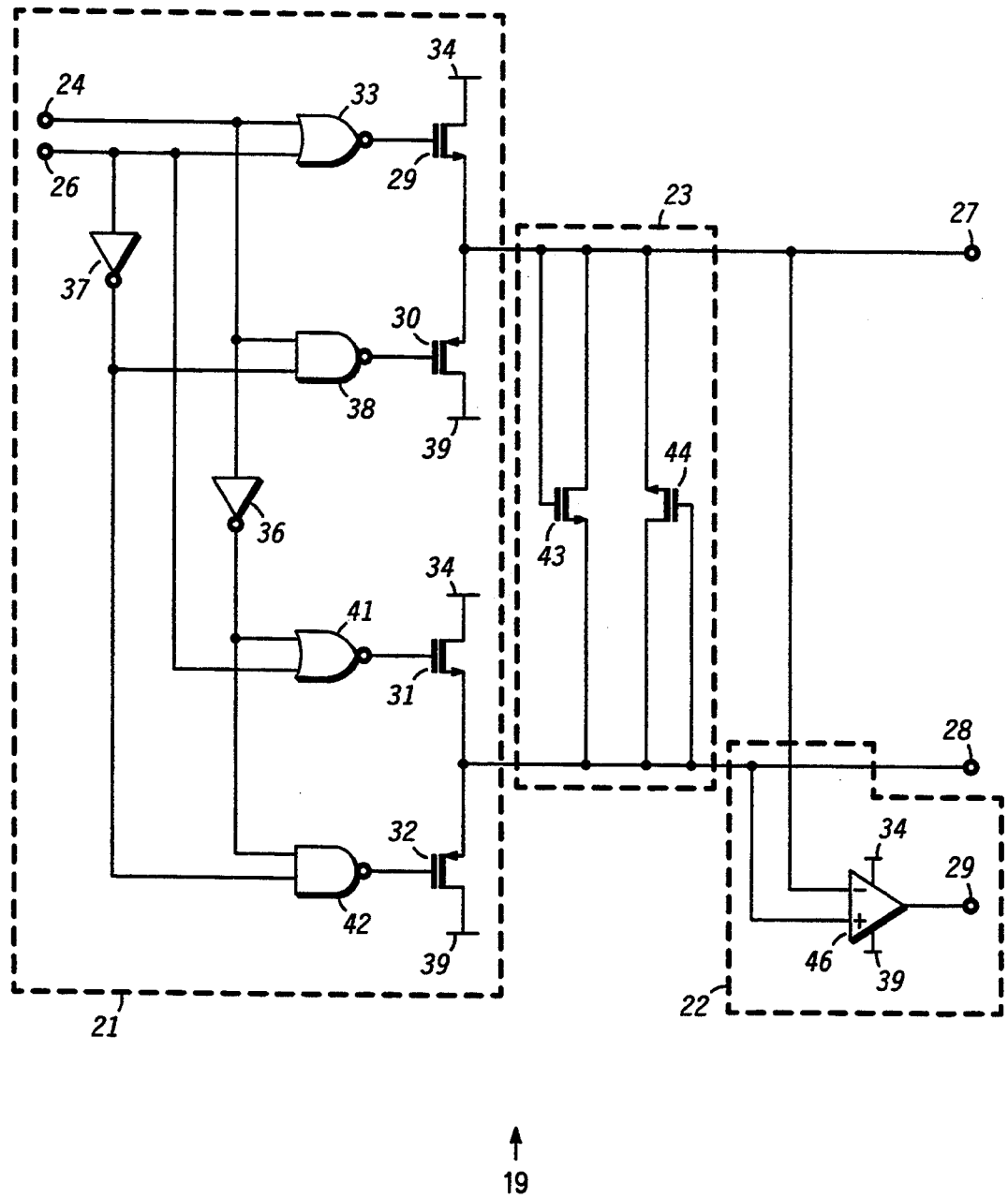
FIG. 2 is a schematic of a transmitter/receiver circuit in accordance with the present invention.

FIG. 2 is a schematic of a transmitter/receiver circuit in accordance with the present invention.

Transmitter/receiver circuit 19 is an interface circuit for translating digital signals of a first magnitude to a second magnitude and vice versa. Transmitter/receiver circuit 19 is generally used to increase system speed by increasing the rate at which data is transferred. A common bottleneck for limiting system speed is input/output circuitry (I/O circuit) which is the external interface for an integrated circuit. Loading on I/O circuitry can vary depending on the application and the number of integrated circuits coupled together. An I/O circuit may have to drive a load which is highly capacitive and inductive at high speeds. Excessive output loading coupled with digital logic levels requiring large voltage transitions (such as CMOS or transistor transistor logic (TTL)) combine to reduce speed at which data is transferred. Reducing the voltage range between digital logic levels greatly increases speed at which data can be transferred for a given output load. Transmitter/receiver circuit 19 comprises a transmitter circuit 21, a receiver circuit 22, and a resistive load 23. Transmitter circuit 21 translates a digital signal having logic levels of a first voltage range to a digital signal having logic levels of a second voltage range. In the preferred embodiment, the first voltage range has a greater magnitude than the second voltage range. Conversely, receiver circuit 22 translates a digital signal having logic levels of the second voltage range to a digital signal having logic levels of the first voltage range. Transmitter circuit 21, receiver circuit 22 and resistive load 23 function independently from one another and each can be eliminated from circuit 19 dependent on the specific application.

Transmitter circuit 21 comprises several logic elements for generating logic control signals. The logic elements respond to two signals, an input signal and a tri-state signal. The input signal is a digital signal to be translated and transmitted by transmitter circuit 21. The input signal is coupled to an input 24. The tri-state signal disables transmitter circuit 21 to allow other circuits to transmit information. The tri-state signal is coupled to an input 26. An inverter 36 has an input coupled to input 24 and an output for providing an inverted input signal. An inverter 37 has an input coupled to input 26 and an output for providing an inverted tri-state signal. Logic elements enable and disable transistors 29, 30, 31 and 32 as will be explained.

A NOR gate 33 provides a disable/enable signal for transistor 29. NOR gate 33 has a first input coupled to input 24, a second input coupled to input 26, and an output. Transistor 29 has a control electrode coupled to the output of NOR gate 33, a first conductive terminal coupled to a terminal of a power supply 34, and a second conductive terminal coupled to a terminal 27.

A NAND gate 38 provides a disable/enable signal for transistor 30. NAND gate 38 has a first input coupled to input 24, a second input coupled to the output of inverter 37, and an output. Transistor 30 has a control electrode coupled to the output of NAND gate 38, a first conductive terminal coupled to a terminal of a power supply 39, and a second conductive terminal coupled to terminal 27.

A NOR gate 41 provides a disable/enable signal for transistor 31. NOR gate 41 has a first input coupled to the output of inverter 36, a second input coupled to input 26, and an output. Transistor 31 has a control electrode coupled to the output of NOR gate 41, a first conductive terminal coupled to the terminal of power supply 34, and a second conductive terminal coupled to a terminal 28.

A NAND gate 42 provides a disable/enable signal for transistor 32. NAND gate 42 has a first input coupled to the output of inverter 36, a second input coupled to the output of inverter 37, and an output. Transistor 32 has a control electrode coupled to the output of NAND gate 42, a first conductive terminal coupled to the terminal of power supply 39, and a second conductive terminal coupled to terminal 28. Device geometries within logic elements 33, 36, 37, 38, 41, and 42 are ratioed to provide equal delays to terminals 27 and 28 from signals at input 24 or at input 26.

In the preferred embodiment, transistors 29, 30, 31, and 32 are in a voltage follower configuration. Transistors 29 and 31 are n-channel enhancement MOSFETs corresponding to a first conductivity type. Transistors 30 and 32 are p-channel enhancement MOSFETs corresponding to a second conductivity type. Transistors 29, 30, 31, and 32 have a gate, a drain, and a source corresponding to the control electrode, first conductive terminal, and second conductive terminal, respectively.

A resistive load 23 couples terminals 27 and 28 together. In the preferred embodiment, resistive load 23 is an active load comprising a transistor 43 and a transistor 44. Transistor 43 has a control electrode and a first conductive terminal coupled to terminal 27 and a source coupled to terminal 28. Transistor 44 has a control electrode and a first conductive terminal coupled to terminal 28 and a source coupled to terminal 27. In the preferred embodiment, transistors 43 and 44 are enhancement MOSFET transistors having a gate, a drain, and a source corresponding to the control electrode, first conductive terminal, and a second conductive terminal, respectively. In the preferred embodiment, transistor 43 and 44 are n-channel enhancement MOSFET corresponding to the first conductivity type. Transistors 43 and 44 are in a diode like configuration which provide bi-directional current flow through resistive load 23. These non-linear resistive elements provide current limiting as a function of device geometries, threshold voltage, and bulk effects. When transistors 29-32 are disabled by the tri-state signal in a one logic state, resistive load 23 equalizes any voltage difference between terminals 27 and 28. Resistive load 23 could also be a resistor but for many types of applications such as gate arrays or standard cells, resistors are not readily available.

Receiver circuit 22 senses a digital signal having logic levels of the second voltage range and provides a digital signal having logic levels of the first voltage range. Receiver circuit 22 comprises a comparator 46. Comparator 46 has a first input coupled to terminal 27, a second input coupled to terminal 28, and an output 29. Comparator 46 is coupled to the terminal of power supply 34 and the terminal of power supply 39 to provide an output swing of the first voltage range.

Operation of transmitter/receiver circuit 19 is best described by function (transmitting and receiving). Assume in this example that power supply 34 outputs five volts and power supply 39 outputs zero volts. A five volt system is common for CMOS digital circuits. A zero logic level is approximately zero volts and a one logic level is approximately five volts for the first voltage range. The input signal and tri-state signal have zero volt or five volt logic levels (first voltage range).

Table 1 is a logic table illustrating the possible logic states of the inputs of transmitter circuit 21 and the outputs of the logic elements, also included is information on which output transistors are enabled. The signal names on the table are abbreviated as follows: IS=input signal, TS=tri-state signal, O33=output of nor gate 33, O38=output of NAND gate 38, O41=output of NOR gate 41, O42 NAND gate 42, T29=transistor 29, T30=transistor 30, T31=transistor 31, and T32=transistor 32. Transistors in the table are either E=enabled or D=disabled by the logic elements.

TABLE 1

| IS | TS | O33 | O38 | O41 | O42 | T29 | T30 | T31 | T32 |
|----|----|-----|-----|-----|-----|-----|-----|-----|-----|
| 0 | 0 | 1 | 1 | 0 | 0 | E | D | D | E |
| 0 | 1 | 0 | 1 | 0 | 1 | D | D | D | D |
| 1 | 0 | 0 | 0 | 1 | 1 | D | E | E | D |
| 1 | 1 | 0 | 1 | 0 | 1 | D | D | D | D |

In table 1 when the tri-state signal is in a one logic level transmitter circuit 21 is disabled. This is indicated by the fact that transistors 29-32 are disabled independent of the logic level of the input signal.

Transmitter circuit 21 has two outputs (terminals 27 and 28) for differential coupling to other circuits for increased noise immunity. Reduced magnitude logic levels provided by transmitter circuit 21 at terminals 27 and 28 are susceptible to noise which could produce errors. Differential coupling reduces noise by providing two outputs which have common noise. In other words, noise injected onto terminal 27 is also injected onto terminal 28 because of their close proximity and similar couplings. A receiver circuit responsive to signals on terminal 27 and terminal 28 is coupled to amplify differential signals and reject common mode signals (noise), thus increasing noise margin.

A one logic level of the second voltage range is generated by transmitter circuit 21 when the input signal has a one logic level of the first voltage range (five volts) and the tri-state signal has a zero logic level of the first voltage range (zero volts). Table 1 shows the output of NOR gate 41 has a one logic level enabling transistor 31 and the output of NAND gate 38 has a zero logic level enabling transistor 30 under these input conditions. Transistors 29 and 32 are disabled. A conductive path is formed comprising transistor 31, resistive load 23, and transistor 30. A key feature of using an active load (transistors 43 and 44) as resistive load 23 is that maximum drive is applied initially to generate the digital signals at terminals 27 and 28 and is later damped as transistors 43 and 44 are enabled which reduces affects such as ringing due to fast transitions. In this example, the source of transistor 31 follows the output of NOR gate 41 to five volts although reduced by the gate to source voltage. Likewise, the source of transistor 30 follows the output of NAND gate 38 to ground although increased by the gate to source voltage. Both transistors 31 and 30 are turned on extremely hard and drives terminal 28 and terminal 27 respectively. A conductive path comprising transistor 31, resistive load 23, and transistor 30 forms when the voltage difference between terminals 27 and 28 is large enough to enable transistor 44. A bias current will stabilize through the conductive path when terminals 27 and 28 reach a final voltage level. The bias current is determined by the transistor geometries of transistors 31, 44, and 30. Complementary logic levels are produced at terminals 27 and 28. A one logic level of the second voltage range is generated at terminal 28. The one logic level of the second voltage range is approximately five volts minus the gate to source voltage of transistor 31 (at the bias current). A zero logic level of the second voltage range is generated at terminal 27. The zero logic level of the second voltage range is approximately the source to gate voltage of transistor 30 (at the bias current). A receiver circuit is responsive to the one logic level at terminal 28 and the zero logic level at terminal 27 such that it outputs a one logic level of the first voltage range.

A secondary factor which affects the magnitude of the logic levels of the second voltage range is back bias or bulk effect. The bulk effect occurs when bulk/source junction becomes reverse biased. The reverse bias has the effect of increasing the magnitude of the threshold voltage for a MOSFET transistor. The bulk effect is used in transmitter circuit 21. In the previous example, transistors 31 and 30 are enabled. Both transistors have increased thresholds due to the bulk effect which reduces the one logic level and increases the zero logic level of the second voltage range. Another benefit provided is a reduction in transistor drive strength due to the increased threshold voltage as the voltage at terminal 28 rises (transistor 31) and as the voltage at terminal 27 decreases (transistor 30). The reduced drive produces a damping effect that minimizes edge problems due to the high speed transitions. The reduced drive also reduces the standby power requirements.

A zero logic level of the second voltage range is generated by transmitter circuit 21 when both the input signal and the tri-state signal have a zero logic level of the first voltage range. Table 1 shows the output of NOR gate 33 has a one logic level enabling transistor 29 and the output of NAND gate 42 has a zero logic level enabling transistor 32 under these input conditions. Transistors 30 and 31 are disabled. In the preferred embodiment, transistor 29 has the same device geometries as transistor 31 and transistor 30 has the same device geometries as transistor 32. Transistor 29 begins to drive terminal 27 towards a one logic state of the second voltage range. Transistor 32 begins to drive terminal 28 towards a zero logic state of the second voltage range. A conductive path is formed by transistor 29, resistive load 23, and transistor 32 when the difference voltage between terminals 27 and 28 are large enough to enable transistor 43 of resistive load 23. A bias current is established through transistor 29, resistive load 23, and transistor 32 when terminal 27 stabilizes at the one logic level of the second voltage range and terminal 28 stabilizes at the zero logic level of the second voltage range. As mentioned previously, the transistor geometries of the enabled devices and secondary effects such as the bulk effect determine the bias current and the output voltage levels. Note that terminal 27 and 28 have logic levels opposite to those in the case when the input signal was in the one logic level. A receiver circuit is responsive to the one logic level at terminal 27 and the zero logic level at terminal 28 such that it outputs a zero logic level of the first voltage range.

The zero and one logic levels of the second voltage range are given voltage magnitudes to further clarify the examples above. Simulation results on a CMOS process flow having approximately 1 micron gate lengths have indicated that a gate to source voltage drop of approximately 1.6 volts for transistors 29-32 can be expected when enabled. This translates to a one logic level of the second voltage range (five volt supply) of approximately 3.4 volts. A zero logic level of the second voltage range will be approximately 1.6 volts The bias current is dependent on the device geometries of transistors 29-32 and resistive load 23.

Receiver circuit 22 translates a digital signal having logic levels of the second voltage range to a digital signal having logic levels of the first voltage range. Comparator 46 amplifies a voltage difference between terminal 27 and terminal 28. In the preferred embodiment, comparator 46 rejects common mode signals to minimize noise problems. Comparator 46 has a negative (−) input corresponding to a first input coupled to terminal 27 and a positive (+) input corresponding to a second input coupled to terminal 28. A one logic level of 3.4 volts at terminal 28 and a zero logic level of 1.6 volts at terminal 27 provides a 1.8 volt positive differential voltage across the inputs of comparator 46 generating a one logic level of the first voltage range (approximately five volts) at output 29. A one logic level of 3.4 volts at terminal 27 and a zero logic level of 1.6 volts at terminal 28 provides a 1.8 volt negative differential voltage across the inputs of comparator 46 generating a zero logic level of the first voltage range (approximately zero volts) at output 29.

A single ended coupling of receiver circuit 22 is used when differential coupling is not desired for increased noise margin or to reduce the number of interconnections. The single ended coupling can be achieved by coupling an input of receiver circuit 22 to either terminal 27 or 28 and coupling the other input to a reference voltage. The reference voltage should be centered between the two logic level of the second voltage range to maximize noise margin. For example, a comparator has a positive input (+) coupled to terminal 28 and a negative (−) input coupled to a voltage reference of 2.5 volts (midway between 3.4 volts and 1.6 volts). A one logic level of 3.4 volts at terminal 28 generates a positive differential voltage of 0.9 volts across the inputs of the comparator. The comparator amplifies the positive differential voltage generating a one logic level of the first voltage range (approximately five volts) at an output. A zero logic level of 1.6 volts generates a negative differential voltage of 0.9 volts across the inputs of the comparator. The negative differential voltage is amplified by the comparator generating a zero logic level of the first voltage range (approximately zero volts) at the output.

Transmitter/receiver circuit 19 overcomes many of the hurdles which limit the speed at which digital information can be transferred. First, reducing the voltage range of a digital signal decreases the time needed to generate a logic level. Second, generating digital signals of a reduced voltage magnitude using transistors in the voltage follower configuration is simple, provides a voltage reduced in magnitude naturally, transfers easily to different process technologies, and is applicable to technologies operating at lower voltages. Third, the voltage follower configuration is a unity gain stage which is not slowed by "Miller capacitance" effects and presents an impedance which dampens reflections when transmitting a signal. Fourth, a differential output increases noise margin by doubling the signal magnitude sensed by a receiver circuit which rejects common mode noise. Fifth, the combination of active load and driver allows peak current drive during the initial transition phase, then provides matching impedance to the transmission line while providing minimal standby power dissipation. Finally, a comparator is used as a receiver circuit which rejects common mode signals (noise) and easily amplifies a differential signal generated at the outputs translating the reduced magnitude digital signal to a digital signal of the first voltage range.

Figure 3:
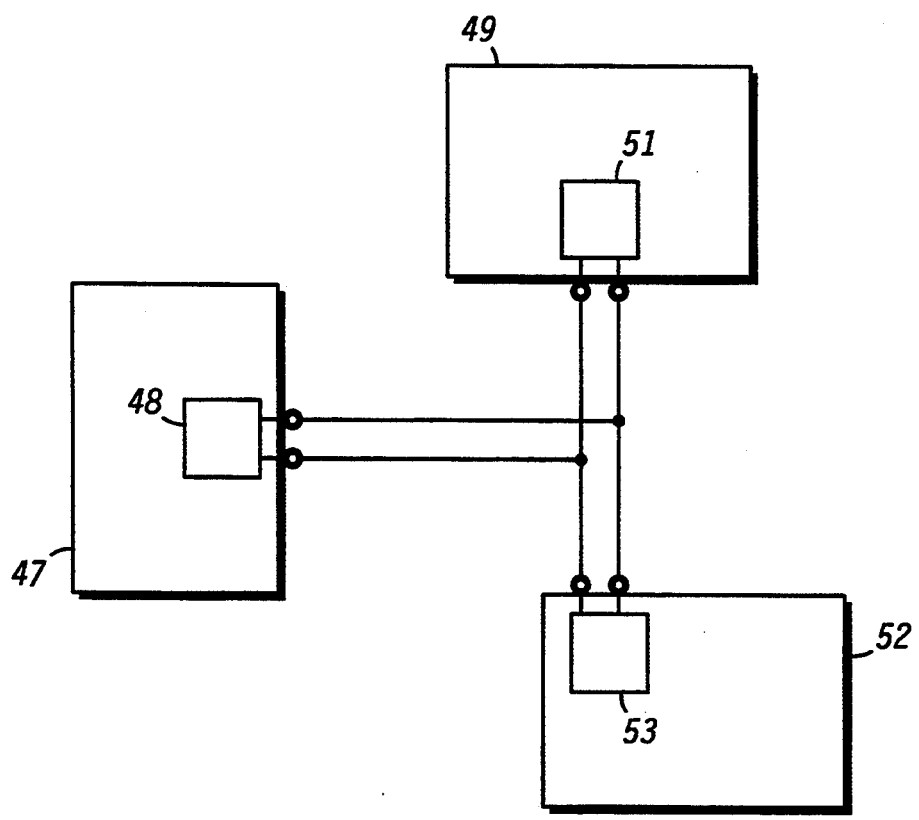
FIG. 3 is a diagram which illustrates a common usage of transmitter/receiver circuits.

FIG. 3 is a diagram which illustrates a common usage of the aforementioned transmitter/receiver circuits.

Circuitry internal to an integrated circuit could often be operated at much higher speeds if they were not limited by the speed of the input/output (I/O) circuitry. Input/output circuitry is the external interface of the integrated circuit, it is responsible for transferring and receiving information to and from the chip. FIG. 3 is a diagram of three integrated circuits 47, 49, and 52. Each integrated circuit 47, 49, and 52 is shown having a single transmitter/receiver circuit 48, 51, and 53, respectively. Transmitter/receiver circuits 48, 51, and 53 are similar to the circuit shown in FIG. 2. In reality, an integrated circuit may have hundreds of transmitter/receiver circuits but for brevity only a single I/O circuit (transmitter/receiver circuit) is shown. Parasitic loading (resistance, capacitance, and inductance) is a main factor in reducing I/O speed. Each transmitter/receiver circuit is coupled differentially to minimize noise problems.

Circuitry internal to integrated circuits 47, 49, and 52 are responsive to standard digital signal levels. Transmitter/receiver circuits 48, 51, and 53 increase transmission speed by sending digital information having logic levels of a reduced voltage range. Receiver circuits are needed to translate the reduced voltage range digital signals to the standard voltage range used internally. For some cases, in place of the active termination, resistors may have to be used to reduce reflections, which can affect a transmitted signal. Translation to other logic levels such as ECL is readily achieved by use of termination resistors to the appropriate termination voltage. Transmitter circuit 19 (of FIG. 2) easily fits in an input/output site location on the integrated circuits 47, 49, and 52 because of it's simplicity and low transistor count.

By now it should be appreciated that there has been provided a transmitter/receiver circuit for interfacing digital signals having different voltage ranges. The transmitter/receiver circuit transmits and receives a digital signal having logic levels of a reduced voltage range. The transmitter/receiver circuit increases the speed at which digital information can be transferred, thereby allowing the integrated circuit to perform at higher operating speeds.

We claim:

1. A transmitter and receiver circuit for translating between a first digital signal of a first voltage range having a first and a second voltage level to a digital of a second voltage range having a first and a second voltage level, the first voltage level of the first digital signal having a magnitude greater than the first voltage level of the digital signal of the second voltage range, the second voltage level of the first digital signal having a magnitude less than the second voltage level of the digital signal of the second voltage range, the circuit comprising:

a first transistor of a first conductivity type configured as a voltage follower, said first transistor having a control electrode coupled to a first terminal of the transmitter and receiver circuit, a first conductive electrode coupled to a first power supply terminal, and a second conductive electrode coupled to a second terminal of the transmitter and receiver circuit;

a second transistor of a second conductivity type configured as a voltage follower, said second transistor having a control electrode coupled to said first terminal of the transmitter and receiver circuit, a first conductive electrode coupled to a second power supply terminal, and a second conductive electrode coupled to said second terminal of the transmitter and receiver circuit, said first and second transistors for providing the digital signal of the second voltage range at said first terminal in response to the first digital signal of the first voltage range being applied to said input of the circuit and wherein the digital signal of the second voltage range is non-inverted; and a comparator having a first input coupled to said second terminal of the transmitter and receiver circuit, a second input for receiving a reference voltage, and an output coupled to a third terminal of the transmitter and receiver circuit, said comparator.

2. The transmitter and receiver circuit of claim 1 wherein said first transistor is enabled while said second transistor is disabled to generate a one logic level of the second voltage range at said second terminal of the transmitter and receiver circuit when the first digital signal of the first range is at a one logic level.

3. The transmitter and receiver circuit of claim 1 wherein said first transistor is disabled while said second transistor is enabled to generate a zero logic level of the second voltage range at said second terminal of the transmitter and receiver circuit when the first digital signal of the first voltage range is at a zero logic level.

4. The transmitter and receiver circuit of claim 1 further including:

a third transistor of said first conductivity type configured as a voltage follower, said third transistor having a control electrode coupled to said first terminal of the transmitter and receiver circuit, a first conductive electrode coupled to a fourth terminal of the transmitter and receiver circuit;

a fourth transistor of said second conductivity type configured as a voltage follower, said fourth transistor having a control electrode coupled to said first terminal of the transmitter and receiver circuit, a first conductive electrode coupled to said terminal of said second supply, and a second conductive electrode coupled to said fourth terminal of the transmitter and receiver circuit; and a resistive load coupled between said second and fourth terminals.

5. The transmitter and receiver circuit of claim 4 wherein said resistive load is a resistor.

6. The transmitter and receiver circuit of claim 4 wherein said resistive load comprises:

a fifth transistor of said first conductivity type having a control electrode coupled to said second terminal of the transmitter and receiver circuit, a first conductive electrode coupled to said second terminal of the transmitter and receiver circuit, and a second conductive electrode coupled to said fourth terminal of the transmitter and receiver circuit; and a sixth transistor of said first conductivity type having a control electrode coupled to said fourth terminal of the transmitter and receiver circuit, a first conductive electrode coupled to said fourth terminal of the transmitter and receiver circuit, and a second conductive electrode coupled to said second terminal of the transmitter and receiver circuit.

7. The transmitter and receiver circuit of claim 4 further including:

a first NOR gate having a first input coupled to said first terminal of the transmitter and receiver circuit, a second input coupled to a fifth terminal of the transmitter and receiver circuit, and an output coupled to said control electrode of said first transistor;

a first inverter having an input coupled to said fifth terminal of the transmitter and receiver circuit and an output;

a first NAND gate having a first input coupled to said first terminal of the transmitter and receiver circuit, a second input coupled to said output of said first inverter, and an output coupled to said control electrode of said second transistor;

a second inverter having an input coupled to said first terminal of the transmitter and receiver circuit and an output;

a second NOR gate having a first input coupled to said output of said second inverter, a second input coupled to said fifth terminal of the transmitter and receiver circuit, and an output coupled to said control electrode of said third transistor; and a second NAND gate having a first input coupled to said output of said second inverter, a second input coupled to said output of said first inverter, and an output coupled to said control electrode of said fourth transistor.

8. A circuit comprising:

a first transistor of a first conductivity type having a control electrode for receiving a digital signal of a first voltage range, a first conductive electrode coupled to a first power supply terminal, and a second conductive electrode coupled to a first terminal of the circuit;

a second transistor of a second conductivity type having a control electrode for receiving a digital signal of said first voltage range, a first conductive electrode coupled to a second power supply terminal, and a second conductive electrode coupled to said first terminal;

a third transistor of said first conductivity type having a control electrode for receiving a digital signal of said first voltage range, a first conductive electrode coupled to said first power supply terminal, and a second conductive electrode coupled to a second terminal of the circuit;

a fourth transistor of said second conductivity type having a control electrode for receiving a digital signal of said first voltage range, a first conductive electrode coupled to said second power supply terminal, and a second conductive electrode coupled to said second terminal; and a resistive load coupled between said first and second terminals, the circuit producing a digital signal of a second voltage range at said first terminal and at said second terminal.

9. The circuit of claim 8 including logic circuitry coupled between said control electrodes of said first, second, third, and fourth transistors and a first and second input of the circuit to which a first digital signal and a control signal are applied respectively, wherein said first transistor and fourth transistor are enabled by said first digital signal and said control signal being in first predetermined logic states thereby forming a conductive path through said first transistor, resistive load, and fourth transistor to generate a one logic level at said first terminal and a zero logic level at said second terminal, said one and zero logic levels being of said second voltage range.

10. The circuit of claim 9 wherein said third transistor and second transistor are enabled by said first digital signal and said control signal being in second predetermined logic states thereby forming a conductive path through said third transistor, resistive load, and second transistor to generate a zero logic level at said first terminal and a one logic level at said second terminal, said zero and one logic levels being of said second voltage range.

11. The circuit of claim 10 including a comparator for sensing a digital signal of said second voltage range and providing a digital signal of said first voltage range, said comparator having a first input coupled either said first terminal or said second terminal, a second input coupled to a reference voltage, and an output.

12. The circuit of claim 8 including a comparator for sensing a digital signal of said second voltage range and providing a digital signal of said first voltage range, said comparator having a first input coupled to said first terminal, a second input coupled to said second terminal, and an output.

13. The circuit of claim 8 wherein said resistive load is a resistor.

14. The circuit of claim 9 wherein said resistive load comprises a fifth transistor of said first conductivity type having a control electrode coupled to said first terminal, a first conductive electrode coupled to said first terminal, and a second conductive electrode coupled to said second terminal; and a sixth transistor of said first conductivity type having a control electrode coupled to said second terminal, a first conductive electrode coupled to said second terminal, and a second conductive electrode coupled to said first terminal.

15. The circuit of claim 8 wherein said first, second, third, and fourth transistors being configured as voltage followers.

16. The circuit of claim 14 wherein said logic circuitry further includes:

a first NOR gate for enabling and disabling said first transistor, said first NOR gate having a first input coupled to said first input of the circuit, a second input coupled to said second input of the circuit, and an output coupled to said control electrode of said first transistor;

a first inverter having an input coupled to said second input of the circuit and an output;

a first NAND gate for enabling and disabling said second transistor, said first NAND gate having a first input coupled to said first input of the circuit, a second input coupled to said output of said first inverter, and an output coupled to said control electrode of said second transistor;

a second inverter having an input coupled to said first input of the circuit and an output;

a second NOR gate for enabling and disabling said third transistor, said second NOR gate having a first input coupled to said output of said second inverter, a second input coupled to said second input of the circuit, and an output coupled to said control electrode of said third transistor; and a second NAND gate for enabling and disabling said fourth transistor, said second NAND gate having a first input coupled to said output of said second inverter, a second input coupled to said output of said first inverter, and an output coupled to said control electrode of said fourth transistor.

* * * * *

UNITED STATES PATENT AND TRADEMARK OFFICE
CERTIFICATE OF CORRECTION

PATENT NO. : 5,371,424
DATED : December 6, 1994
INVENTOR(S) : John H. Quigley et al.

It is certified that error appears in the above-indentified patent and that said Letters Patent is hereby corrected as shown below:

In column 11, line 46, claim 1, delete "digital of" and insert therefor --digital signal of--.

In column 12, line 33, claim 4, delete "to a" and insert therefor --to said terminal of said first supply, and a second conductive electrode coupled to a--.

Signed and Sealed this

Eleventh Day of July, 1995

Attest:

BRUCE LEHMAN

Attesting Officer        Commissioner of Patents and Trademarks